United States Patent [19]
Phipps

[11] Patent Number: 5,381,105
[45] Date of Patent: Jan. 10, 1995

[54] METHOD OF TESTING A SEMICONDUCTOR DEVICE HAVING A FIRST CIRCUIT ELECTRICALLY ISOLATED FROM A SECOND CIRCUIT

[75] Inventor: John P. Phipps, Phoenix, Ariz.

[73] Assignee: Motorola, Inc., Schaumburg, Ill.

[21] Appl. No.: 17,159

[22] Filed: Feb. 12, 1993

[51] Int. Cl.⁶ .............................................. G01R 1/04
[52] U.S. Cl. .................................. 324/765; 324/769; 437/8
[58] Field of Search ............... 324/158 R, 158 T, 452, 324/158 P; 437/8

[56] References Cited

U.S. PATENT DOCUMENTS

| | | | |
|---|---|---|---|
| 3,870,953 | 3/1975 | Boatman et al. | 324/73 R |
| 4,823,088 | 4/1989 | Fukada | 324/456 |
| 4,876,584 | 10/1989 | Taylor | 357/23.13 |
| 5,034,845 | 7/1991 | Murakami | 361/56 |

Primary Examiner—Kenneth A. Wieder
Assistant Examiner—Barry C. Bowser
Attorney, Agent, or Firm—Robert F. Hightower; Joe E. Barbee

[57] ABSTRACT

Testing of a semiconductor device (10, 30) is facilitated by forming the semiconductor device (10, 30) to have a first portion (17) that is electrically isolated from a second portion (19, 27). Testing is first performed on the first portion (17) of the semiconductor device (10, 30). After the testing is complete, the first portion (17) of the semiconductor device (10, 30) is electrically coupled to the second portion (19, 27) of the semiconductor device (10, 30).

14 Claims, 1 Drawing Sheet

METHOD OF TESTING A SEMICONDUCTOR DEVICE HAVING A FIRST CIRCUIT ELECTRICALLY ISOLATED FROM A SECOND CIRCUIT

BACKGROUND OF THE INVENTION

The present invention relates, in general, to semiconductor devices, and more particularly, to a novel method of testing a semiconductor device.

In the past, the semiconductor industry has utilized input protection networks to prevent damage to high impedance electrodes of semiconductor devices such as the gate electrode of metal oxide semiconductor (MOS) transistors. These input protection networks generally are used to minimize the amount of damage caused by electro-static discharge to the gate electrode.

Although the input protection network prevents damage, it also presents a problem while testing the MOS transistor's gate oxide rupture voltage. Such testing is often referred to as determining the gate oxide integrity, or testing the gate oxide. During testing, the input protection network typically functions as a voltage clamp that limits the maximum voltage that can be applied to the transistor's gate. Since the voltage required to test the gate oxide rupture voltage is typically higher than the clamp voltage, the input protection network prevents accurate testing of the gate oxide rupture voltage.

Accordingly, it is desirable to have a method of testing a semiconductor device that is not limited by the device's internal circuitry.

SUMMARY OF THE INVENTION

Briefly stated, the present invention includes a method of testing a semiconductor device. Testing is performed on a first portion of the semiconductor device. After the testing is complete, the first portion of the semiconductor device is electrically coupled to a second portion of the semiconductor device. The method facilitates testing portions of the semiconductor device without sacrificing protection of the device.

DETAILED DESCRIPTION OF THE DRAWINGS

Figure 1:
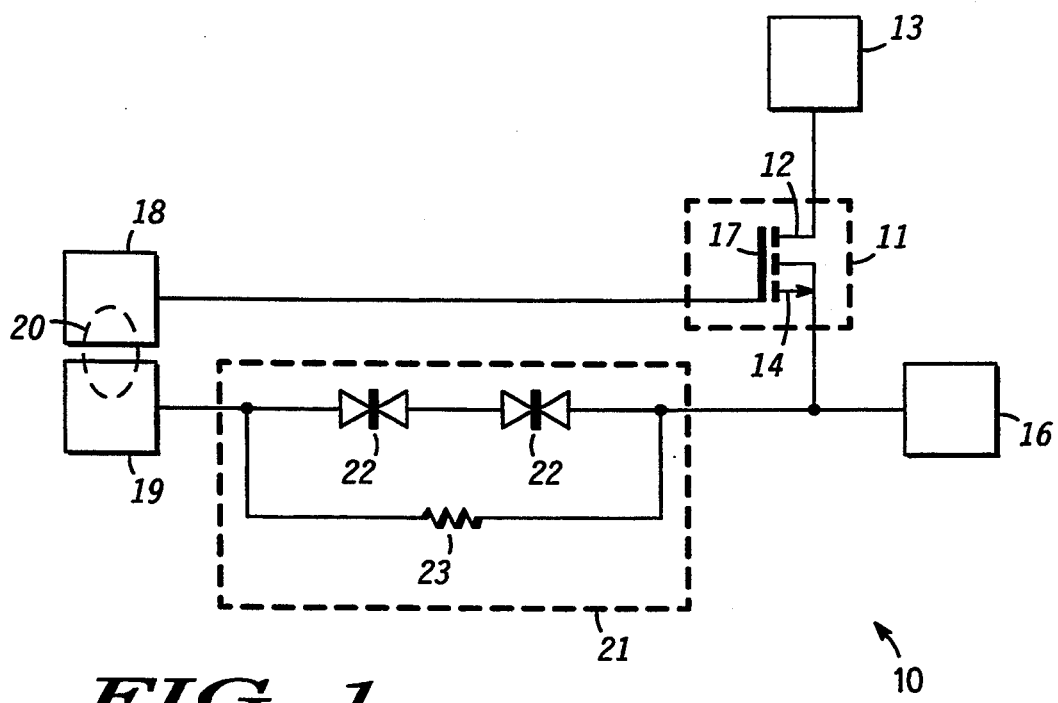
FIG. 1 schematically illustrates an embodiment of a semiconductor device that facilitates testing in accordance with the present invention.

FIG. 1 schematically illustrates a semiconductor device 10 that includes a gate bonding pad 18 and an input protection bonding pad 19 that facilitate testing device 10, as will be seen hereinafter. Device 10 also includes a transistor 11. In the preferred embodiment, transistor 11 is a power metal oxide semiconductor (MOS) field effect transistor (FET). Transistor 11 has a first current carrying electrode or drain 12 that is connected to a drain bonding pad 13, and a second current carrying electrode or source 14 that is connected to a source bonding pad 16. A control or gate electrode 17 is connected to gate bonding pad 18. Drain 12 and source 14 can be electrically connected to external circuitry (not shown) by attaching bonding wires (not shown) to pads 13 and 16, respectively.

An input protection network 21 is used to protect gate 17 from electro-static discharge. Network 21 has a first terminal connected to pad 16, and a second terminal connected to input protection bonding pad 19. Network 21 can be formed from a variety of circuit configurations including, but not limited to, one or more pair of back-to-back diodes, a series limiting resistor, or one or more pair of back-to-back diodes in parallel with a resistor. In the preferred embodiment, input protection network 21 includes two pair of series connected back-to-back diodes 22 in parallel with a resistor 23.

Pads 18 and 19 are formed to be electrically isolated in order to facilitate testing a gate oxide rupture voltage of transistor 11, often referred to as determining the gate oxide integrity. The electrical isolation forms device 10 into a first circuit, that includes gate 17, and a second circuit, including pad 19, that is electrically isolated from the first circuit. Testing of the gate oxide rupture voltage typically is performed by applying a test voltage between gate 17 and source 14, then measuring current flowing between gate 17 and source 14. Such current is typically referred to as the gate-to-source leakage current. The test voltage value at which the gate-to-source leakage current changes rapidly, is generally considered the gate oxide rupture voltage. In the preferred embodiment, the test voltage is varied from approximately fourteen to approximately thirty volts, while continuously monitoring the gate-to-source leakage current. In this preferred embodiment, a test voltage value that creates a gate-to-source leakage current in excess of approximately one hundred nano-amps is typically considered the gate oxide rupture voltage. Having pads 18 and 19 electrically isolated from each other does not interfere with testing the gate oxide rupture voltage, as will be seen hereinafter.

Subsequent to testing the gate oxide rupture voltage, pads 18 and 19 are electrically connected thereby connecting the second terminal of network 21 to gate 17. Pads 18 and 19 can be formed with a variety of shapes and configurations as long as pads 18 and 19 are electrically isolated from each other, and can be electrically connected subsequent to testing. In the preferred embodiment, each of pads 18 and 19 is between 100 and 120 microns square. Also in this preferred embodiment, pads 18 and 19 are separated by a gap of approximately ten to twenty microns in order to provide the electrical isolation. Subsequent to testing, pads 18 and 19 can be electrically connected by a variety of means including, but not limited to, attaching a bonding wire 20, illustrated by a dashed line, that overlaps both pads 18 and 19, or swaging metal from one bonding pad across the gap to the other bonding pad by using an ultrasonic bonding tool or a probe tip. Alternately, a conductive material such as a conductive epoxy or solder may be applied to connect pads 18 and 19. With network 21 connected, gate 17 is typically clamped to a voltage less than the gate oxide rupture voltage. Consequently, electrically isolating gate 17 from network 21 prior to testing, facilitates testing the gate oxide rupture voltage of device 11, and also permits connecting gate 17 and network 21 subsequent to testing thereby protecting device 10 from electro-static discharge.

Figure 2:
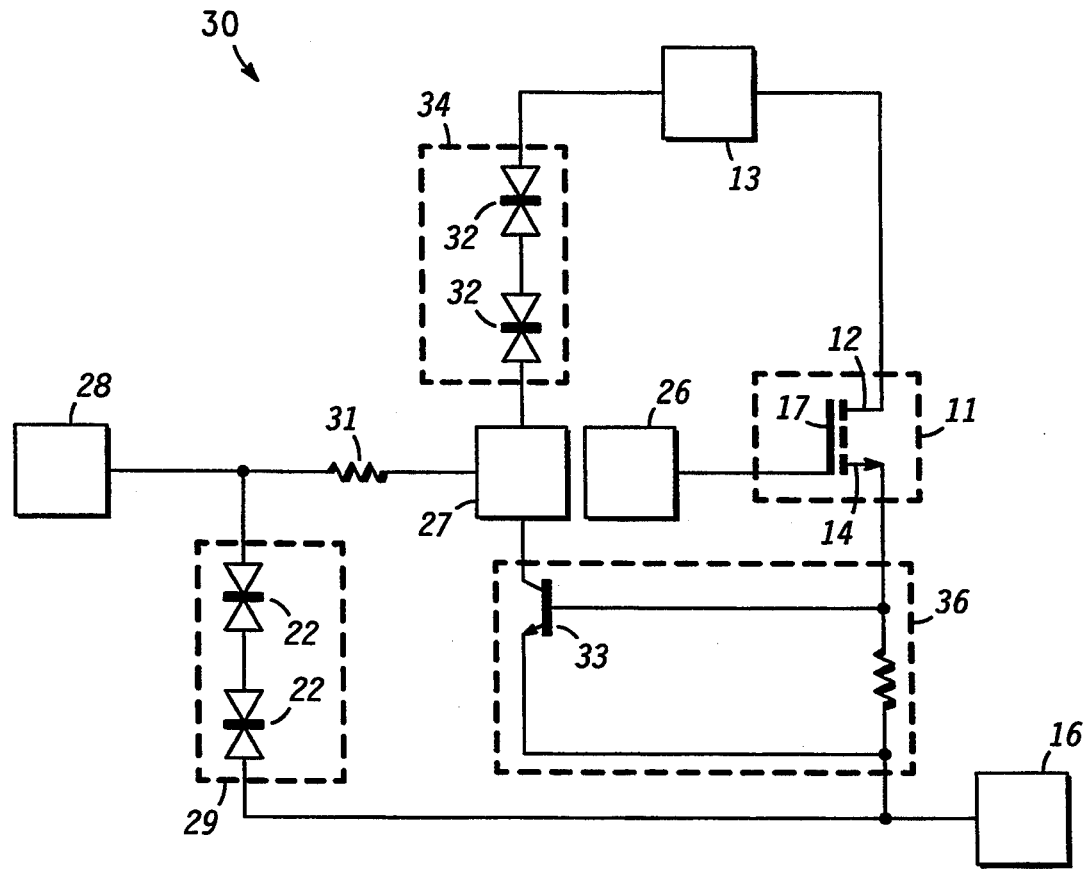
FIG. 2 schematically illustrates another embodiment of a semiconductor device that facilitates testing in accordance with the present invention.

FIG. 2 schematically illustrates a semiconductor device 30 having an alternate embodiment to device 10 of FIG. 1. Elements of FIG. 2 that are the same as FIG. 1 1 have the same reference numerals. Gate electrode 17 of transistor 11 is connected to a first bonding pad or gate-node bonding pad 26. Gate-node pad 26 is electrically isolated from a continuity-node pad 27 thereby isolating gate 17 from a gate bonding pad 28 and from other circuitry connected to pad 27. The other circuitry includes an input protection network 29, a drain-voltage limit circuit 34, a series resistor 31, and a gate-voltage limit circuit 36. Input protection network 29 is similar to network 21 discussed in FIG 1, and has a first terminal connected to pad 28 and a second terminal connected to pad 16. In the preferred embodiment, network 29 includes two pair of series connected back-to-back diodes 22. Voltage limit circuit 34 limits the maximum voltage applied to drain 12, often referred to as the maximum sustain voltage. Circuit 34 has a first terminal connected to pad 13 and a second terminal connected to pad 27. In the preferred embodiment, circuit 34 includes at least two pair of series connected back-to-back diodes 32. Resistor 31 functions to limit the maximum voltage applied to gate 17 via pad 28, and has a first terminal connected to pad 28 and a second terminal connected to pad 27. Circuit 36 is used to limit the maximum voltage applied to gate 17 when current is flowing out of source 14. A first terminal of circuit 36 is connected to pad 27, a second terminal is connected to pad 16, and a third terminal is connected to drain 14.

Since network 29, resistor 31, and circuits 34 and 36 are electrically isolated from pad 26, they are also electrically isolated from gate 17. Consequently, the gate oxide rupture voltage of gate 17 can be tested, as explained in the discussion of FIG. 1, without interference from network 29, resistor 31, and circuits 34 and 36. Subsequent to testing, pads 26 and 27 are electrically connected by methods such as those explained in the discussion of FIG. 1. Thereafter, network 29 functions to protect gate 17 similarly to network 21 shown in FIG. 1.

By now it should be appreciated that there has been provided a novel method of testing a semiconductor device. Testing of the device is facilitated by using electrically isolated bonding pads until testing is complete. Subsequent to testing, the split bonding pads are electrically connected to ensure proper operation of the device.

I claim:

1. A method of testing a semiconductor device comprising:
providing a power MOS FET having a gate electrode coupled to a gate bonding pad, and a source electrode coupled to a source bonding pad;
providing an input protection network having a plurality of series connected back-to-back diode pairs, the input protection network having a first terminal coupled to the source bonding pad, and a second terminal coupled to an input protection bonding pad;
testing a gate oxide rupture voltage of the power MOS FET by applying a test voltage between the gate bonding pad and the source bonding pad, and monitoring a gate-to-source current of the power MOS FET; and
electrically connecting the gate bonding pad to the input protection bonding pad.

2. The method of claim 1 wherein electrically connecting the gate bonding pad to the input protection bonding pad includes attaching a bonding wire that electrically shorts the gate bonding pad to the input protection bonding pad.

3. The method of claim 1 wherein testing the gate oxide rupture voltage includes applying approximately fourteen to thirty volts between the gate bonding pad and the source bonding pad.

4. The method of claim 1 wherein the step of providing the power MOS FET includes having the gate bonding pad that is approximately 100 to 120 microns square, and having the source bonding pad that is approximately 100 to 120 microns square.

5. A method of testing a semiconductor device comprising:
providing a transistor of the semiconductor device having a gate coupled to a first bonding pad of the semiconductor device, and a source coupled to a second bonding pad;
providing an electrical circuit having a first terminal coupled to the source, and a second terminal coupled to a third bonding pad of the semiconductor device wherein the first bonding pad is electrically isolated from the third bonding pad;
testing a portion of the transistor; and
electrically coupling the third bonding pad to the first bonding pad.

6. The method of claim 5 wherein testing the portion of the transistor includes testing a gate oxide rupture voltage of the transistor.

7. The method of claim 5 wherein providing the transistor having the gate coupled to the first bonding pad includes having the first bonding pad that is approximately 100 to 120 microns square.

8. The method of claim 5 wherein the step of providing the electrical circuit includes separating the first bonding pad from the third bonding pad by a gap of approximately ten to twenty microns.

9. The method of claim 5 wherein providing the electrical circuit includes providing the electrical circuit having a plurality of series connected back-to-back diodes.

10. A method of testing a semiconductor device comprising:
providing a semiconductor device having a first circuit and a second circuit wherein a portion of the first circuit is electrically isolated from the second circuit;
testing a portion of the first circuit; and
electrically connecting the first circuit to the second circuit including electrically connecting an input protection network to a transistor of the semiconductor device.

11. The method of claim 10 wherein electrically connecting the first circuit to the second circuit further includes electrically connecting a first bonding pad to a second bonding pad.

12. The method of claim 10 wherein electrically connecting the first circuit to the second circuit further includes attaching a bonding wire that overlaps a first bonding pad and a second bonding pad.

13. The method of claim 10 wherein electrically connecting the first circuit to the second circuit further includes electrically connecting a first bonding pad that is approximately 100 to 120 microns square to a second bonding pad.

14. The method of claim 10 wherein electrically connecting the first circuit to the second circuit further includes electrically connecting a first bonding pad to a second bonding pad wherein the first bonding pad and the second bonding pad are separated by a gap of approximately ten to twenty microns.

* * * * *